(12) United States Patent
Kiuchi et al.

(10) Patent No.: US 8,673,542 B2
(45) Date of Patent: Mar. 18, 2014

(54) METHOD AND SYSTEM FOR CHARGED PARTICLE BEAM LITHOGRAPHY

(75) Inventors: Taichi Kiuchi, Tokyo (JP); Takahisa Hasegawa, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 13/571,533

(22) Filed: Aug. 10, 2012

(65) Prior Publication Data

US 2013/0040241 A1 Feb. 14, 2013

(30) Foreign Application Priority Data

Aug. 12, 2011 (JP) .................................. 2011-176468

(51) Int. Cl.
*G03F 7/20* (2006.01)

(52) U.S. Cl.
CPC .............. *G03F 7/2059* (2013.01); *G03F 7/704* (2013.01); *Y10S 430/143* (2013.01)
USPC .......................................... 430/296; 430/942

(58) Field of Classification Search
CPC ....... G03F 1/20; G03F 7/2037; G03F 7/2059; G03F 7/704
USPC .................................................. 430/296, 942
See application file for complete search history.

(56) References Cited

U.S. PATENT DOCUMENTS 8,057,970 B2 11/2011 Fujimura et al.

*Primary Examiner* — Christopher Young
(74) *Attorney, Agent, or Firm* — The Webb Law Firm

(57) ABSTRACT

There is disclosed a lithography method and system implemented by a charged particle beam passed through a shaping slit member having plural circular apertures of different diameters. The method and system operate to delineate a circular pattern by shooting the shaped circular beam passed through the desired circular aperture onto a workpiece. The method and system consists of causing circular beams shaped using different ones of the circular apertures to be shot onto the workpiece such that the circular beams are coincident with each other in center position to thereby delineate a circular pattern of a desired size. Consequently, circular patterns in a wide range of sizes can be obtained, although a limited number of circular apertures are used.

3 Claims, 10 Drawing Sheets

METHOD AND SYSTEM FOR CHARGED PARTICLE BEAM LITHOGRAPHY

BACKGROUND OF THE INVENTION

1. Field of the Invention

The present invention relates to a method and system for charged particle beam lithography and, more particularly, to a method and system adapted for charged particle beam lithography when a circular pattern is lithographically written on a workpiece.

2. Description of Related Art

A variable-shaped electron beam lithography system has been developed and used as a machine that writes a fine pattern at high speed using a charged particle beam (e.g., an electron beam). In this lithography system, a variable-shaped beam of rectangular cross section is formed by the use of two shaping apertured plates each having a rectangular aperture and a shaping deflector interposed between the two apertured plates. The beam is directed at an arbitrary position on a workpiece. The workpiece is irradiated with the beam while varying the shape and area of the cross section of the beam in succession. Consequently, a microscopic pattern can be lithographically delineated at high speed.

In such a variable-shaped electron beam lithography system, it is difficult to write a circular pattern by combining rectangular cross sections of beams. Therefore, a circular aperture apart from the rectangular apertures is formed. Lithography is done using an electron beam of circular cross section formed by the use of the circular aperture.

FIG. 7 schematically illustrates a variable-shaped electron beam lithography system having a circular aperture. An electron beam emitted from an electron gun 1 is directed at a first shaping slit member 4, which is provided with a rectangular aperture 4a. The electron beam of rectangular cross section passed through the aperture 4a is then passed through a shaping lens 6 and directed at a second shaping slit member 7 similarly having a rectangular aperture 7a. The shaping lens 6 brings an image of the aperture 4a into focus at the position of the aperture 7a in the second shaping slit member 7. The shape and cross-sectional area of the beam passed through the aperture 7a in the second shaping slit member 7 can be varied by changing the position of the focused image by means of a shaping deflector 5 located between the first and second shaping slit members 4, 7. The beam passed through the aperture 7a is shot onto a workpiece 13 through an electrostatic lens 9, an objective lens 10, a positioning deflector 11, and a positioning sub-deflector 12.

On the other hand, the second shaping slit member 7 has plural circular apertures A, B, and C of different diameters adjacent to the rectangular aperture 7a. When a circular pattern is written, this circular aperture is used. That is, when a circular pattern is delineated photolithographically, the shaped beam passed through the first shaping slit member 4 is deflected by the shaping deflector 5 such that the beam hits any one of the circular apertures A, B, and C. The beam passed through any one of the circular apertures and given a circular cross section is directed at a desired position on the workpiece 13 while being tightly focused through the electrostatic lens 9, objective lens 10, positioning deflector 11, and positioning sub-deflector 12.

The diameter of each beam of circular cross section can be fundamentally switched between three different values by using circular apertures A (small), B (medium), and C (large) selectively according to the purpose. If the number of circular apertures is increased, the diameter can be switched between a greater number of values. However, the manufacturing costs and space occupied by the slit members impose limitations on the number of the circular apertures.

Accordingly, the incident energy is varied by adjusting the shot time while using plural (e.g., three) shaped electron beams of different diameters. The diameter obtained by development is varied to thereby produce circular patterns of more varied sizes.

FIG. 8 illustrates the relationship between incident energy intensity and the diameter of circular pattern obtained after development. An electron beam 50 of diameter Da is shaped using a circular aperture A, for example. A resist-coated material was irradiated with the beam 50 for three different shot times. The distribution of incident energies that the resist underwent on a line 50D passing through the center of the circular cross section of the beam is shown in FIG. 8. The horizontal axis indicates the position on the workpiece, and O denotes the center of the beam cross section. The vertical axis indicates the incident energy intensity.

Incident energy intensity distribution curve 51 was obtained when the shot time was shortest. Distribution curves 52 and 53 were derived with longer shot times. It can be seen that the incident energy intensity is increased with increasing shot time. L indicates development level of the resist. The distance between the intersections at which the development level intersects with the distribution curves 51, 52, 53 indicates the diameter of the circular pattern obtained by the development. It can be seen from FIG. 8 that as the shot time is increased, the diameter of the circular pattern obtained by development increases from Da+, to Da++, and then to Da+++.

Circular patterns of three different diameters can be obtained by adjusting the shot time between three levels using the electron beam shaped employing the circular aperture A in this way. Circular patterns of nine different diameters in total can be obtained when two additional circular apertures are used if the shot time is varied similarly between three levels.

Where the size is adjusted by adjusting the shot time of the shaped beam (incident energy/electron beam dose) as described above, the following problems take place.

If the size (diameter) is adjusted by the electron beam dose, the variation in size caused when the electron beam dose is changed by a unit amount varies depending on the resist sensitivity. Therefore, when lithography is done on a workpiece, it may not be possible to cover a desired size of circle depending on resist.

This problem is hereinafter described in further detail. FIG. 9 shows an example obtained when the diameter of a circular pattern obtained after development was varied by using three electron beams of different diameters shaped by the use of three circular apertures A, B, and C of different sizes and varying the shot time so as to vary the electron beam dose (see U.S. Pat. No. 8,057,970).

It can be seen from FIG. 9 that the range of diameters capable of being realized by an electron beam shaped using the circular aperture A and the range of diameters capable of being realized by an electron beam shaped using the circular aperture B overlap with each other. Furthermore, it can be seen that the range of diameters capable of being realized by an electron beam shaped using the circular aperture B and the range of diameters capable of being realized by an electron beam shaped using the circular aperture C overlap with each other.

Therefore, it is possible to cope with requirements by adjusting the shot time of an electron beam shaped by using any one of the three circular apertures A, B, and C, from diameter D1 to diameter DN of the required circular patterns.

On the other hand, the same three circular apertures A, B, and C were used. Resist materials different in sensitivity and/or performance from the resist material used in the case of FIG. 9 were used. The diameter of the circular pattern obtained after development varied when the electron beam dose was varied. Variations in the pattern diameter and variations in the beam dose are plotted in FIG. 10. For this resist material, the range of variation of the diameter of the circular pattern obtained after development caused by variation of the incident energy is narrower than for the resist material used in the case of FIG. 10. Consequently, unlike the case of FIG. 9, the diameter of the maximum pattern obtained with the aperture A and the diameter of the minimum pattern obtained with the aperture B do not overlap with each other in the case of FIG. 10. Similarly, the diameter of the maximum pattern obtained with the aperture B and the diameter of the minimum pattern obtained with the aperture C do not overlap with each other. When such nonoverlapping regions BD1 and BD2 exist, it follows that a circular pattern having a diameter lying in any of these ranges cannot be formed.

Especially, resists currently under development are intended to enhance resolution by reducing blurs of the resists themselves. This course of action leads to a smaller decrease in the diameter of the pattern obtained after development when the electron beam dose is changed by a unit amount. Therefore, it can be said that it is becoming increasingly difficult to adjust the size variation by the beam dose.

SUMMARY OF THE INVENTION

In view of the foregoing, the present invention has been made. It is an object of the present invention to provide a charged particle beam lithography method and system capable of increasing the range of variation of the size of a circular pattern obtained after development by making an exposure with charged particle beams shaped with circular apertures of different sizes such that the beams overlap with each other at the same position.

According to the present invention, lithography is performed with charged particle beams shaped using circular shaping slits of different sizes such that the beams overlap with each other at the same position. Consequently, the adjustable range of variation of the size of the circular pattern obtained by development can be increased. Even where a resist is used, which results in a small variation in diameter of the pattern obtained after development when the electron beam dose is changed by a unit amount, a desired size of circular pattern can be obtained.

The foregoing object is achieved by a method of charged particle beam lithography according to the present invention, the method being adapted to be implemented by a charged particle beam lithography system having: a beam source of a charged particle beam; a first shaping slit member having a first rectangular aperture hit by the charged particle beam emitted from the beam source; a second shaping slit member having plural circular apertures of different diameters; a shaping lens for focusing the charged particle beam passed through the aperture in the first shaping slit member onto the second shaping slit member; and a deflector for deflecting the beam passed through the aperture in the first shaping slit member such that the deflected beam impinges on a desired one of the circular apertures in the second shaping slit member. The shaped circular beam passed through the desired circular aperture in the second shaping slit member is shot onto a workpiece to delineate a circular pattern. The method of lithography consists of causing circular beams shaped by different ones of the circular apertures in the second shaping slit member to be shot onto the workpiece such that the circular beams are coincident with each other in center position, whereby a circular pattern of a desired size is delineated.

The present invention also provides a charged particle beam lithography system having: a beam source of a charged particle beam; a first shaping slit member having a first rectangular aperture hit by the charged particle beam emitted from the beam source; a second shaping slit member having plural circular apertures of different diameters; a shaping lens for bringing the charged particle beam passed through the aperture in the first shaping slit member into focus on the second shaping slit member; and a deflector for deflecting the charged particle beam passed through the aperture in the first shaping slit member and directing the beam at a desired one of the circular apertures in the second shaping slit member. The shaped circular beam passed through the desired one of the circular apertures in the second shaping slit member is shot onto a workpiece to delineate a circular pattern. The lithography system further includes a memory in which relationships of types of individual ones and combinations of the circular apertures used for lithographic shots to beam doses for various values of diameter of circular patterns are stored. Based on the diameter or size of a circular pattern to be delineated, data about a type of individual ones and combinations of the circular apertures and about beam doses used for shots are read from the memory. Based on the data, a circular pattern is delineated by making a single shot of the shaped circular beam passed through any one of the circular apertures in the second shaping slit member or by causing circular beams shaped with different ones of the circular apertures in the second shaping slit member to be shot onto a workpiece such that the beams are overlapped with each other in center position. Consequently, a circular pattern is delineated.

BRIEF DESCRIPTION OF THE DRAWINGS

FIG. 5 is a graph illustrating data stored in a memory 20a.

DESCRIPTION OF THE PREFERRED EMBODIMENTS

Figure 1:
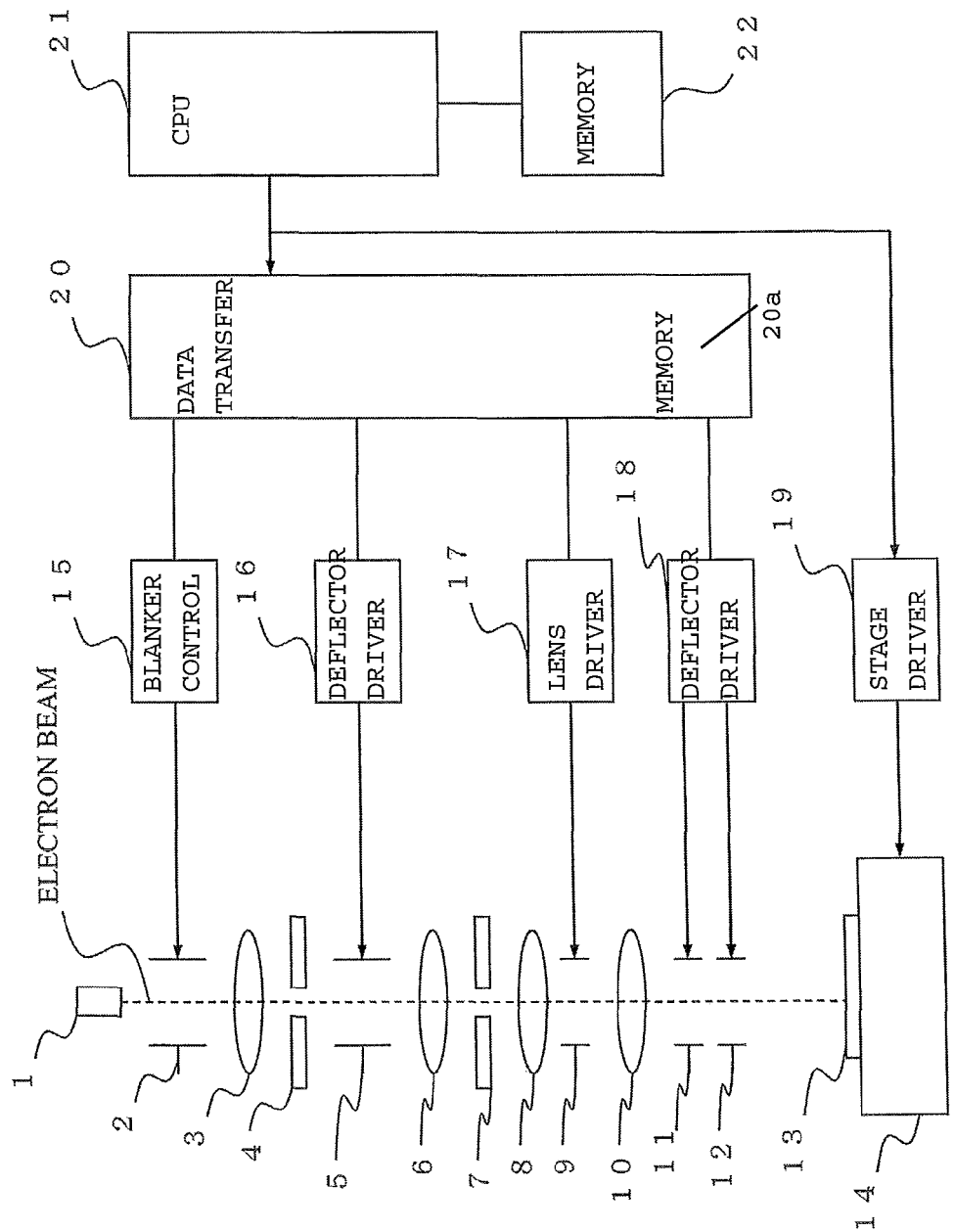
FIG. 1 is a schematic view showing the configuration of a charged particle beam lithography system for implementing the present invention.

The preferred embodiments of the present invention are hereinafter described in detail. FIG. 1 schematically shows the configuration of an electron beam lithography system for implementing the method of the present invention. The system of FIG. 1 is similar in configuration with the system already described in connection with FIG. 7 except that components, including a blanker, are added. In both FIGS. 1 and 7, like components are indicated by like reference numerals.

Referring to FIG. 1, an electron gun 1 acts as a charged particle beam source that produces a beam of charged particles. The beam produced from an electron gun 1 is shot at a first shaping slit member 4 via a blanker 2 and via a shot lens 3.

Figure 7:
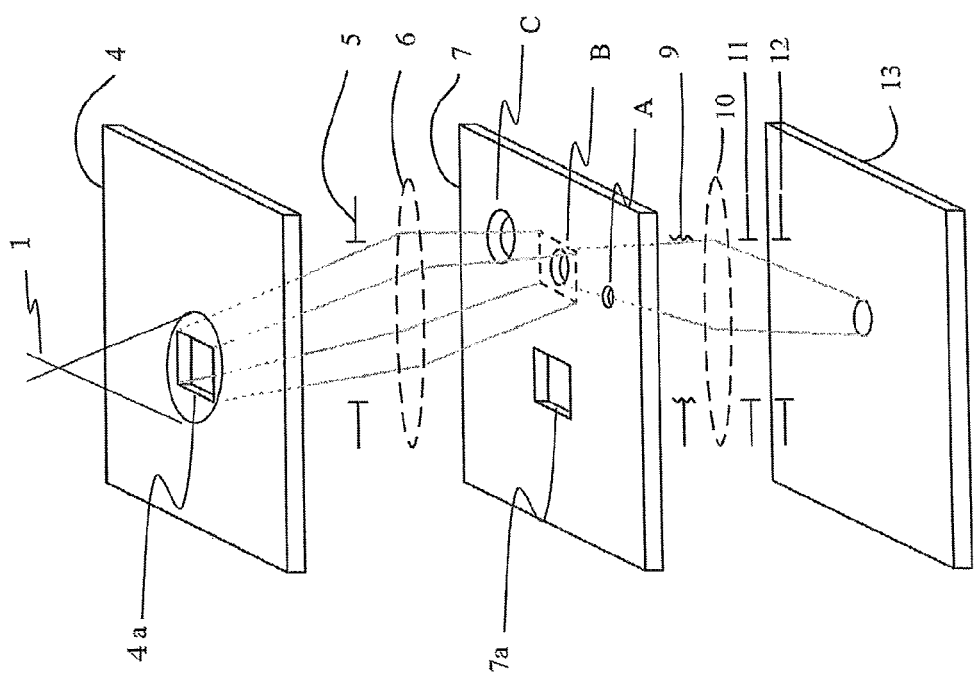
FIG. 7 is a schematic exploded perspective view of a variable-area electron beam lithography system having circular apertures.
Figure 8:
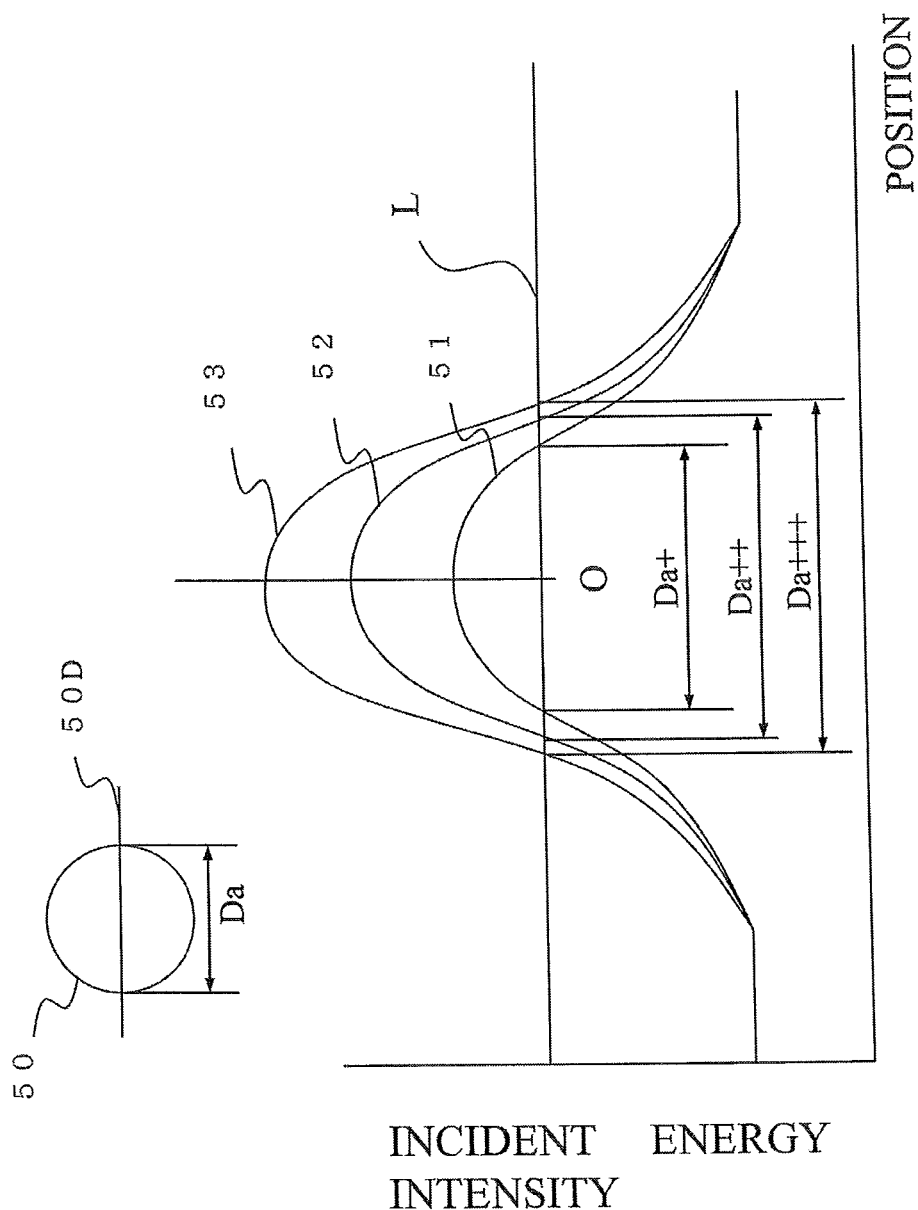
FIG. 8 is a graph illustrating the relationship between incident energy intensity and the diameter of each circular pattern obtained after development.
Figure 9:
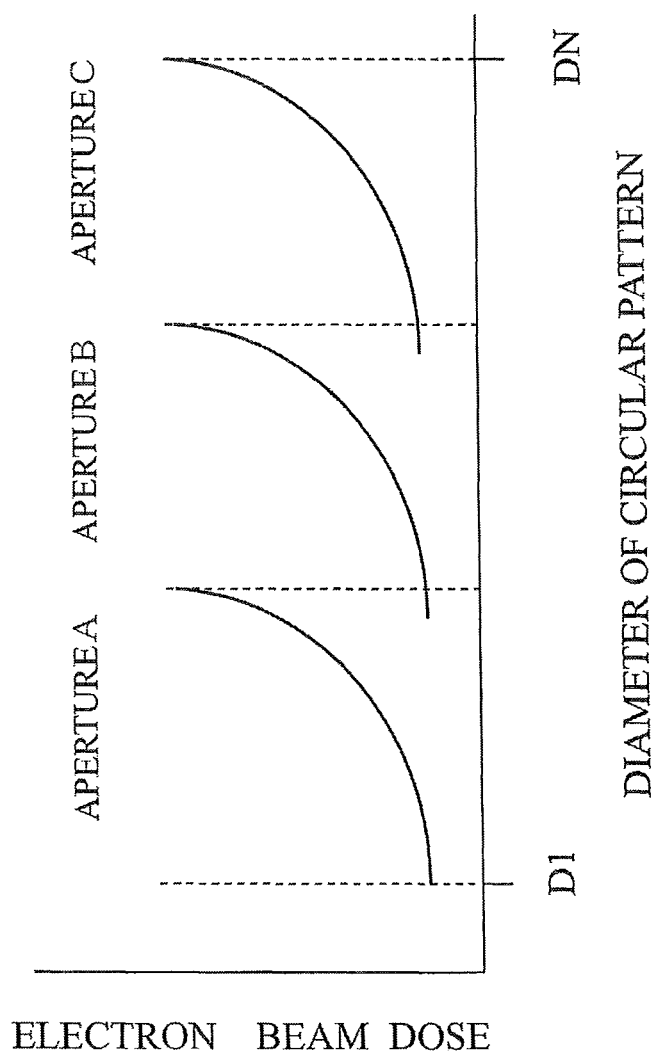
FIG. 9 is a graph showing the manner in which the diameter of each circular pattern obtained after development is varied when the electron beam dose of each of electron beams shaped using circular apertures A, B, and C, respectively, changes.
Figure 10:
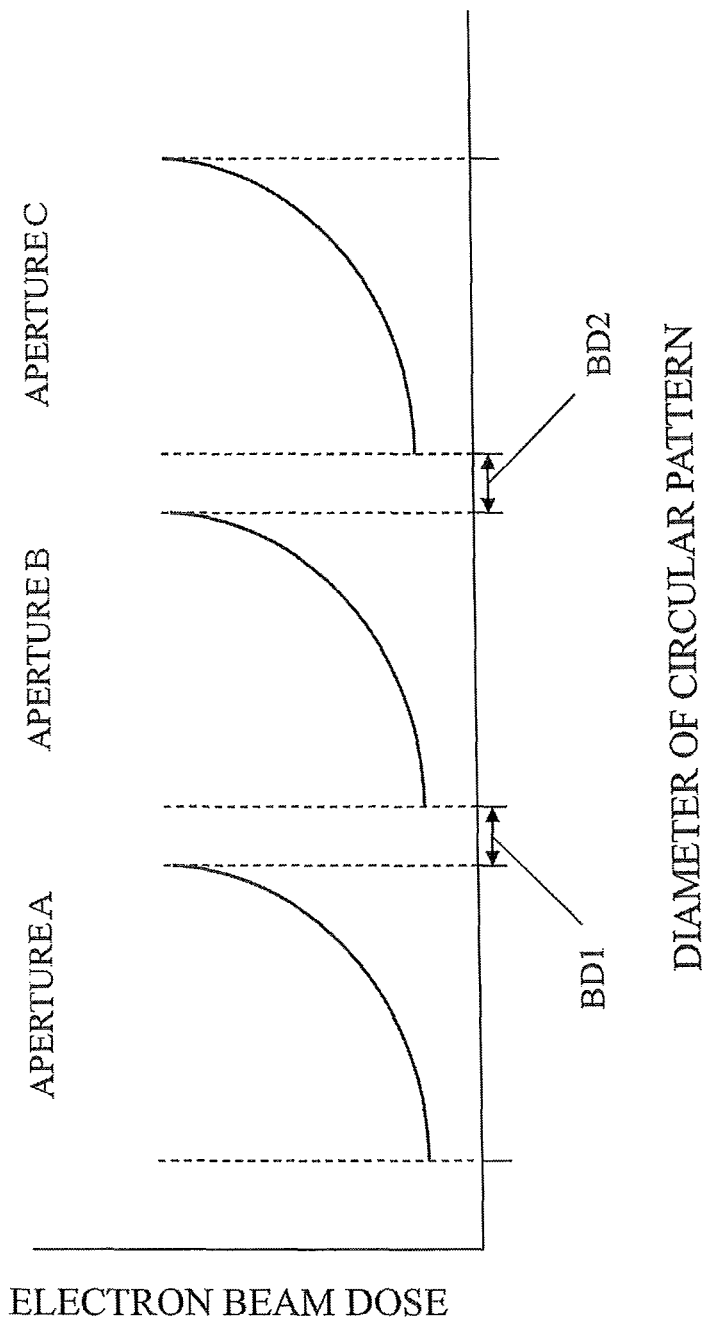
FIG. 10 is a graph similar to the graph of FIG. 9 but in which resists which are different in sensitivity and performance are used.

The first shaping slit member 4 is provided with a rectangular aperture 4a (see also FIG. 7). The electron beam of rectangular cross section passed through the aperture is shot via a shaping lens 6 onto a second shaping slit member 7 similarly having a rectangular aperture 7a (see FIG. 7). The shaping lens 6 focuses an image of the aperture 4a into the position of the aperture 7a in the second shaping slit member 7. The shaping lens 6 can vary the shape and area of the cross section of the beam passed through the aperture 7a in the second shaping slit member 7 by varying the position of the image by means of a shaping deflector 5 disposed between the first and second slit members 4, 7. The shaped electron beam passed through the aperture in the second slit member 7 is made to impinge on a workpiece 13 placed on a workpiece stage 14 via a demagnification lens 8, an electrostatic lens 9, an objective lens 10, a positioning deflector 11, and a positioning sub-deflector 12.

A CPU 21 for performing control operations reads pattern data from a pattern data memory 22 and sends the data to a blanker control circuit 15, a shaping deflector driver circuit 16, an electrostatic lens driver circuit 17, and a positioning deflector driver circuit 18 via a data transfer circuit 20. Furthermore, the CPU 21 controls the workpiece stage 14 on which the workpiece 13 is placed via a stage driver circuit 19 to move the workpiece 13 for each field. The operation of the system configured in this way is described below.

Fundamental lithographic operations using shaped electron beams of rectangular cross sections are first described. The pattern data stored in the pattern data memory 22 are successively read out by the CPU 21 and fed to the data transfer circuit 20. Based on the data from the data transfer circuit 20, the shaping deflector driver circuit 16 drives the shaping deflector 5. The positioning deflector driver circuit 18 drives the positioning deflector 11 and positioning sub-deflector 12. As a result, based on each set of pattern data, the cross section of the electron beam is shaped into a pattern geometry (rectangular form) based on the data by the shaping deflector 5. At this time, each shot of the electron beam is taken from the blanker 2 in response to a blanking signal from the blanker control circuit 15. Therefore, beams shaped in the form of a pattern based on the data are successively shot onto the workpiece 13, thus delineating a pattern of a desired geometry.

To correct a focus deviation caused by a deflection position within a deflection range defined by the positioning deflector driver circuit 18, the electrostatic lens driver circuit 17 cooperates with the positioning deflector driver circuit 18 to operate the electrostatic lens 9.

When lithography is done in a next region on the workpiece 13, the workpiece stage 14 is moved a given distance (e.g., a distance corresponding to one field) under instructions given to the stage driver circuit 19 from the CPU 21. The distance moved by the workpiece stage 14 is monitored by a laser metrology tool (not shown). The position of the workpiece stage 14 is precisely controlled according to the results of the metrology performed by the metrology tool.

The second shaping slit member 7 shown in FIG. 1 has circular apertures A (small), B (moderate), and C (large) shown in FIG. 7. When a circular pattern or an assemblage of circular patterns is delineated, each circular beam shaped to have a size corresponding to the diameter of the circular aperture A, B, or C is taken from the second shaping slit member 7 and made to impinge on the workpiece 13 in succession by directing the beam passed through the first shaping slit member 4 at any one of the circular apertures A, B, and C in the second shaping slit member 7 as described previously.

In the prior art described previously, a single shot is done, and the shot time (irradiation time/incident energy) is adjusted to adjust the size of the circular pattern obtained after development. In the present invention, a single circular pattern is written with plural shots (e.g., two shots). For example, a circular beam of smaller diameter shaped using the circular aperture A is first shot and then a circular beam of moderate diameter shaped using the circular aperture B is shot at the same position in an overlapping manner.

During each of these shots, the beam irradiation time (electron beam dose) is controlled by the blanker 2. Thus, the size of the circular pattern obtained after development can be accurately adjusted.

Figure 2:
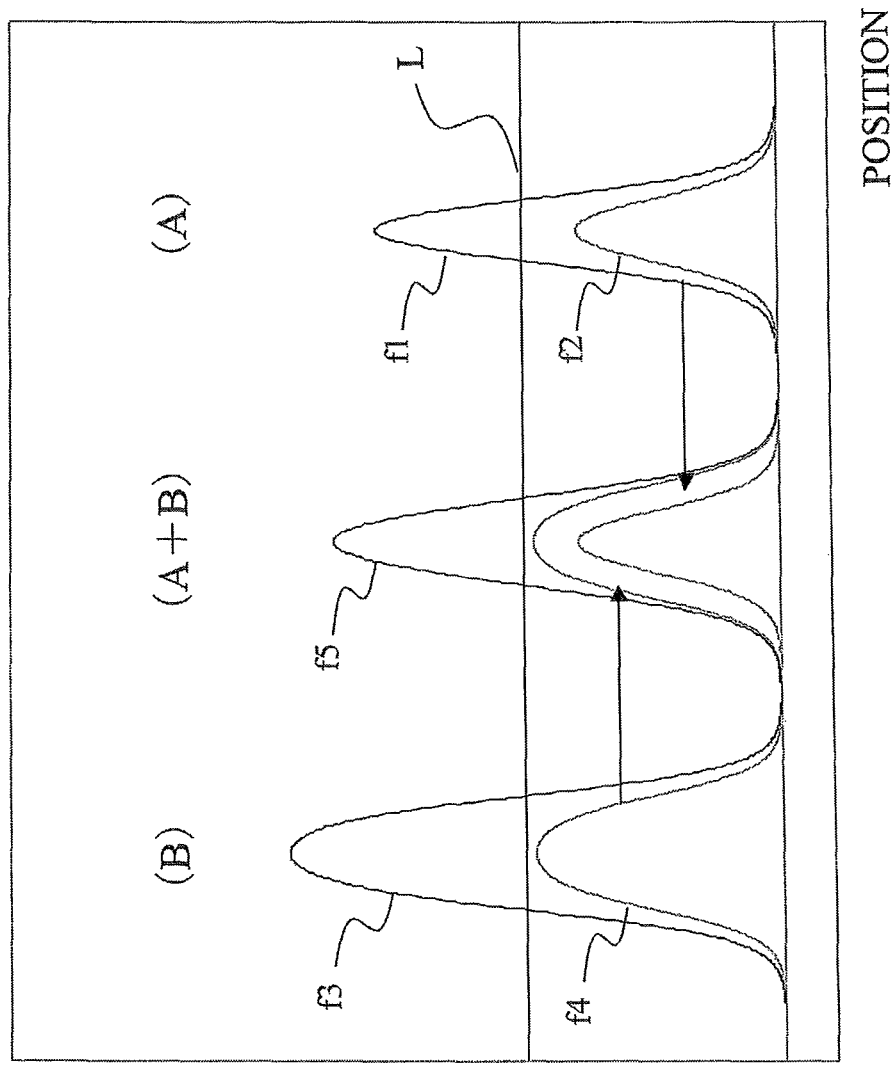
FIG. 2 is a graph showing the incident energy intensity distributions of charged particle beams which are passed through circular apertures A and B and thus cross-sectionally shaped to the sizes of the apertures, as well as incident energy intensity distributions obtained by beams which are shot at the same position but with a half dose.

In FIGS. 2, (A) and (B) show the incident energy intensity distributions obtained when electron beams shaped into a smaller diameter and a moderate diameter, respectively, by being passed through the circular apertures A and B, respectively, were shot in a shot time T. Also, incident energy intensity distributions were measured under similar conditions except that the shot time T was halved (T/2) and thus the dose was halved, and the resulting incident energy intensity distributions are also shown in (A) and (B).

In (A) of FIG. 2, f1 indicates an incident energy intensity distribution obtained when the smaller-diameter beam shaped with the circular aperture A was shot once in the shot time T. f2 indicates an incident energy intensity distribution obtained when this smaller-diameter beam was shot in shot time T/2.

On the other hand, in (B), f3 indicates an incident energy intensity distribution obtained when the moderate-diameter beam shaped with the circular aperture B was shot once in the shot time T. f4 indicates an incident energy intensity distribution obtained when this moderate-diameter beam was shot in shot time T/2.

Summing the incident energy intensity distribution f2 produced by the shot with the half energy amount using the circular aperture A with the incident energy intensity distribution f4 produced by the shot with the half energy amount using the circular aperture B results in an incident energy intensity distribution as indicated by f5 in (A+B). It can be seen that this incident energy intensity distribution f5 is smaller in intensity than the energy distribution f1 owing to the circular aperture A and greater in intensity than the energy intensity distribution f3 owing to the circular aperture B.

When the incident energy intensity distribution f5 is developed at the same resist resolution level L, the diameter of the resulting circular pattern is observed to be midway between the value obtained when the circular aperture A is used and the value obtained when the circular aperture B is used.

Figure 3:
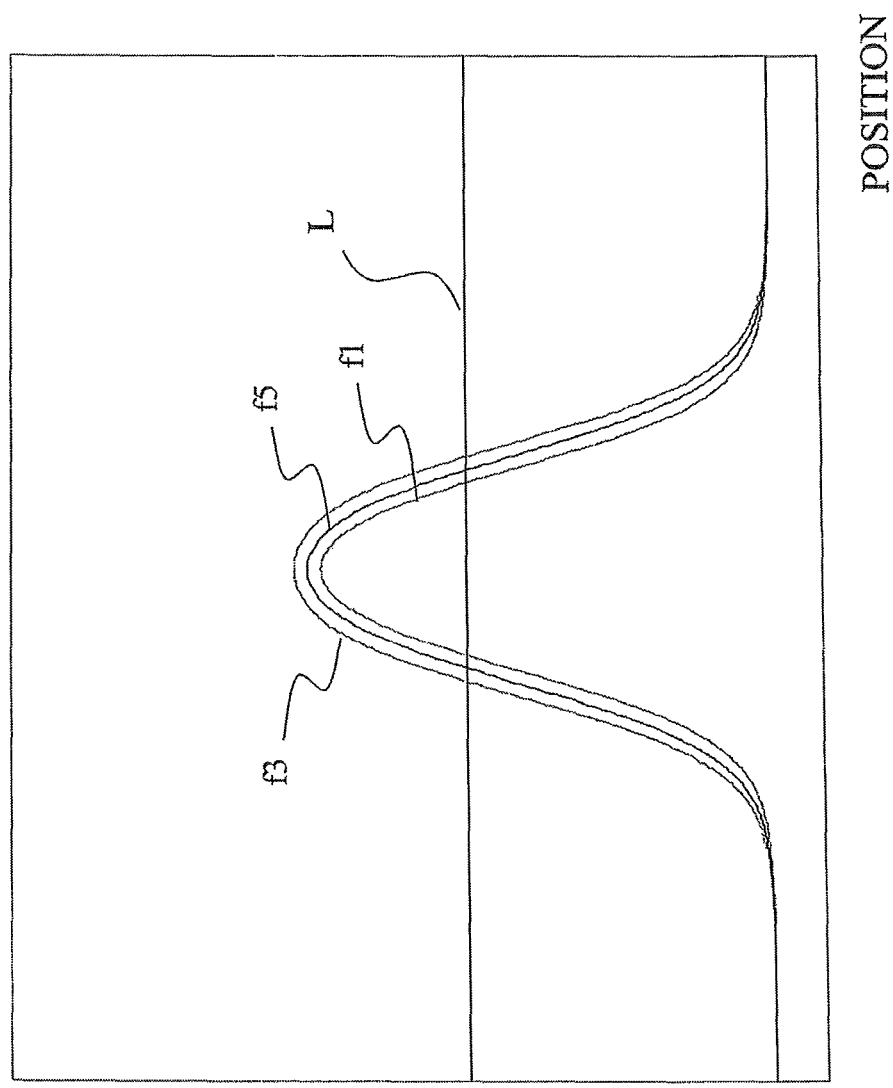
FIG. 3 is a graph in which incident energy intensity distributions obtained with the circular apertures A and B, respectively, are compared with an incident energy intensity distribution obtained by summation of incident energy intensity distributions arising from two shots of their respective half beam doses.

FIG. 3 shows an energy intensity distribution obtained by superimposing the incident energy intensity distributions f1, f3, and f5 such that they are coincident with each other in center position. Since the distribution f5 does not slacken, but is neatly nested between the distributions f1 and f3, it is seen that if two circular beams of different diameters are shot at the same location (i.e., two shots) in an overlapping manner to obtain a circular pattern, characteristics such as blur given to the resist are not different from the case where a similar pattern is formed using a single shot (f1, f3).

When the smaller-diameter beam shaped using the circular aperture A is shot in a shot time of 55T/100 and the moderate-diameter beam shaped using the circular aperture B is shot at the same location in a shot time of 55T/100, for example, the incident energy intensity distribution f5 owing to the combination of the two shots is closer to the distribution f3 than in FIG. 3. Conversely, when two shots are made each in a shot time of 45T/100, for example, the incident energy intensity distribution f5 owing to the combination of the two shots is closer to the distribution f1 than in FIG. 3. Accordingly, the size of a circular pattern obtained after development can be accurately adjusted by adjusting the shot times of two shots.

In the above description, an example of two shots using the smaller-diameter beam owing to the circular aperture A and the moderate-diameter beam owing to the circular aperture B is taken as an example. It is obvious that if two shots respectively, using the moderate-diameter beam owing to the circular aperture B and the larger-diameter beam owing to the circular aperture C are combined, the inventive method can be similarly applied to a circular pattern of a larger diameter.

Furthermore, in the above description, an example in which the shot times of two shots are set equal to each other (i.e., in a 1:1 relationship) is taken as an example. However, the invention is not restricted to this example. Two shots can be combined in such a way that the relationship between the shot times of the two shots is varied from the 1:1 relationship. For instance, the heating effect of the resist on the second shot can be lessened by setting the ratio of the shot times of the first and second shots to 4:6, i.e., the shot time of the first shot is reduced. As a result, a pattern of appropriate size can be obtained at a sensitivity maximally close to the intrinsic sensitivity, i.e., without inducing sensitivity variations.

Figure 4:
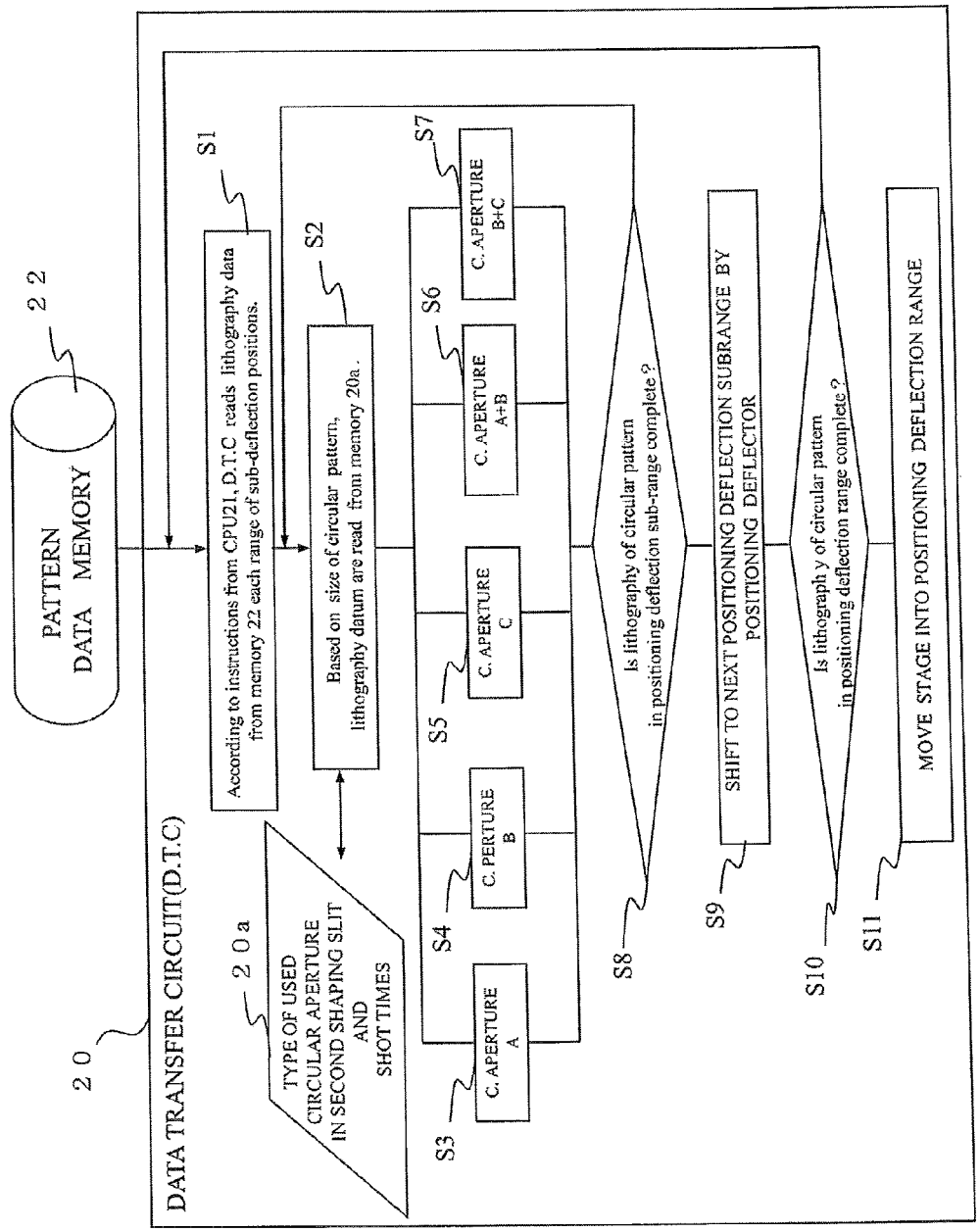
FIG. 4 is a flowchart illustrating operations of a charged particle beam lithography system according to the present invention.

FIG. 4 is a flowchart illustrating a first sequence of operations of the present invention. The pattern data memory 22 stores pattern data about a multiplicity of patterns to be delineated, the pattern data being in a given format. The data transfer circuit 20 has a memory 20a in which data about sizes of circular patterns, data about the types (A, B, C, A+B, and B+C) of circular apertures in the second shaping slit member used according to shot size, and data about shot times (beam doses) are stored. Based on sets of data successively read out by the CPU 21, the following operations are carried out. This flowchart illustrates a case in which pattern data about a circular pattern is read out.

The data transfer circuit 20 reads lithographic data about the circular pattern from the pattern data memory 22 for each range of sub-deflection positions according to instructions from the CPU 21 (step S1). Then, based on the size of the circular pattern indicated by the lithographic data, the type of the used circular aperture in the second shaping slit member corresponding to the size of the circular pattern and the shot times of the electron beams are read from the memory 20a (step S2).

Figure 5:
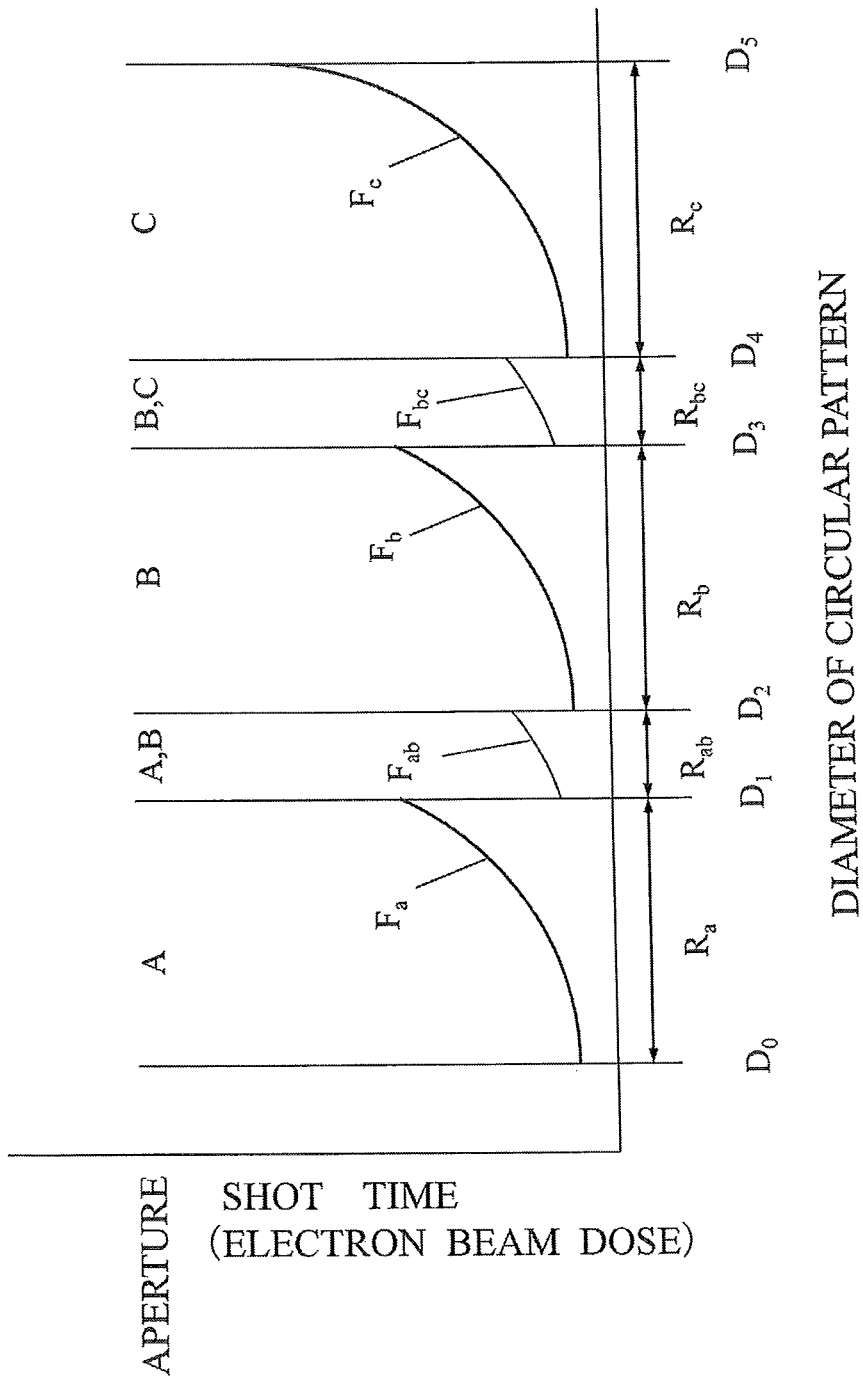

A table or approximation formula showing curves indicated by $F_a$, $F_{ab}$, $F_b$, $F_{bc}$, and $F_c$ in FIG. 5 indicating the relationships between diameters and shot times (electron beam doses) in each of five ranges in a case where the diameters of circular patterns that can be delineated by the lithography system lie in a range from $D_0$ to $D_5$ is stored in the memory 20a. As shown in FIG. 5, these five ranges include three ranges $R_a$ ($D_0 \leq R_a < D_1$), $R_b$ ($D_2 \leq R_b < D_3$), and $R_c$ ($D_4 \leq R_c \leq D_5$) delineated by using the circular apertures A, B, and C, respectively and separately, as well as a range $R_{ab}$ ($D_1 \leq R_a < D_2$) which lies between the ranges $R_a$ and $R_b$ and in which the circular apertures A and B are used and a range $R_{bc}$ ($D_3 \leq R_a < D_4$) which lies between the ranges $R_b$ and $R_c$ and in which the circular apertures B and C are used.

If the size of a circular pattern read out lies in the range $R_a$, $R_b$, or $R_c$, control proceeds to step S3, S4, or S5, where shots are made in shot times read from the memory 20a using circular beams shaped by the use of any circular aperture based on data about the circular aperture A, B, or C and shot times read from the memory 20a, thus delineating a circular pattern of a size read out.

If the size of the circular pattern read out lies in the range $R_{ab}$, control goes to step S6, where a circular beam shaped using the circular aperture A and a circular beam shaped using the circular aperture B are shot successively at the same location, based on data about the circular aperture A+B and shot times read from the memory 20a. The shot times of the circular beams are a half of the shot time read from the memory 20a in the aforementioned 1:1 case.

If the size of the circular pattern read out lies in the range $R_{bc}$, control goes to step S7, where a circular beam shaped using the circular aperture B and a circular beam shaped using the circular aperture C are successively shot at the same location, based on data about the circular aperture B+C and shot times read from the memory 20a. At this time, the shot times of the circular beams are similarly a half of the shot time read from the memory 20a.

In step S8, a decision is made as to whether lithography of the circular pattern in the positioning deflection subrange is complete. If the lithography is incomplete, control returns to step S2, where lithography of a next circular pattern is performed through to completion. If the lithography in the positioning deflection subrange is complete, a shift to a next positioning deflection subrange is made by the positioning deflector 11 (step S9). Control goes back to step S1 until lithography of circular patterns in every positioning deflection subrange is completed, and circular patterns are successively delineated.

Figure 6:
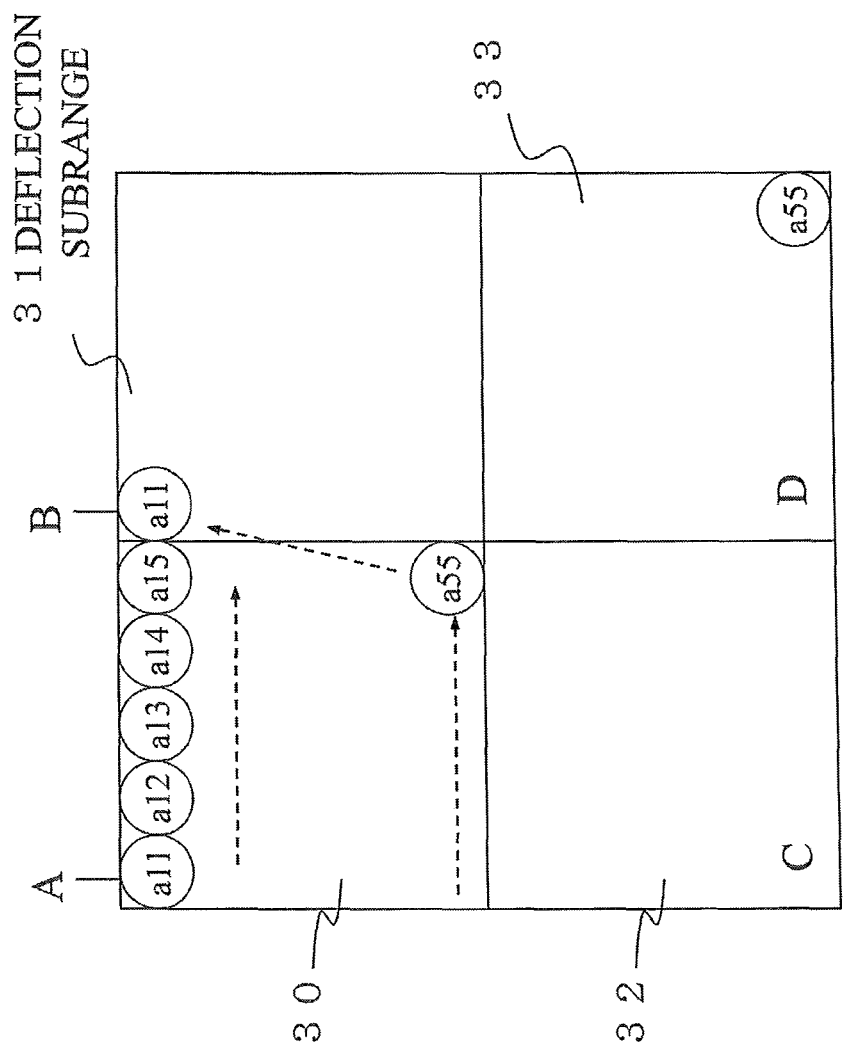
FIG. 6 is a diagram illustrating the manner in which a pattern is delineated in a deflection subrange.

FIG. 6 illustrates exposure in deflection subranges 30-33 each of which can be exposed at a time by the positioning sub-deflector 12. First, the starting point of deflection is brought to position A by the positioning deflector 11. A first shot all is made to the deflection subrange by the positioning sub-deflector 12. Then, successive shots a12-a55 are made. Such shots are made repeatedly within the deflection subrange 30. When exposure of this deflection subrange is completed with the shot a55, the beam position is deflected to a starting position B in the next deflection subrange 31 by the positioning deflector 11.

Such a lithographic operation is repeated. Whenever one lithographic operation is carried out, a check is made as to whether lithography in the positioning deflection range is complete (step S10). If the lithographic operation is not complete, control returns to step S1, where repetitive lithography is performed in a next positioning deflection range. If the lithography is complete, the CPU 21 controls the stage driver circuit 19, moving the workpiece stage 14 into a next positioning deflection range (step S11).

According to this embodiment, sizes of circular patterns, types (A, B, C, A+B, B+C) of circular apertures in the second shaping slit member used according to the shot sizes, and shot times (electron beam doses) are stored in the memory 20a. Therefore, according to the diameter of a circular pattern to be delineated, the type of the circular aperture used and shot time are read from the memory 20a and a beam of the circular pattern is shot. In consequence, a circular pattern of a desired size can be delineated.

In the above embodiment, the types of circular apertures used and shot times are stored in the memory 20a according to diameters of circular patterns to be photolithographically delineated. When circular shots are made in the case of a shot partition, data indicating the types of circular apertures used according to diameters and shot times may be added as lithographic data about the circular shots and stored in the pattern data memory.

Thus, the memory 20a of FIG. 4 is dispensed with. When shot data is read from the pattern data memory 22, if circular shots are made, the types of circular apertures used according to the diameters and data indicative of shot times are read out together. Based on the data, control proceeds to steps S3-S7, where shots of a desired circular pattern can be made.

In the above-described embodiment, an example in which an electron beam is used as a charged particle beam is taken. The present invention is not restricted to this example. The invention can be similarly applied to cases where various ion beams are used.

As described in detail thus far, according to the present invention, any desired circular pattern in a wide range of sizes can be delineated by shooting circular beams shaped with the use of plural ones of the circular apertures in the second apertured member at the same location on a workpiece in an overlapping manner while adjusting the beam dose.

Having thus described our invention with the detail and particularity required by the Patent Laws, what is desired protected by Letters Patent is set forth in the following claims.

The invention claimed is:

1. A method of charged particle beam lithography adapted to be implemented by a charged particle beam lithography system having: a beam source of a charged particle beam; a first shaping slit member having a first rectangular aperture hit by the charged particle beam emitted from the beam source; a second shaping slit member having plural circular apertures of different diameters; a shaping lens for focusing the charged particle beam passed through the aperture in the first shaping slit member onto the second shaping slit member; and a deflector for deflecting the beam passed through the aperture in the first shaping slit member such that the deflected beam impinges on a desired one of the circular apertures in the second shaping slit member, the system operating to delineate a circular pattern by shooting the shaped circular beam passed through the desired circular aperture in the second shaping slit member onto a workpiece, said method comprising the step of:

causing circular beams shaped by different ones of the circular apertures in the second shaping slit member to be shot onto the workpiece such that the circular beams are coincident with each other in center position to thereby delineate a circular pattern of a desired size.

2. A method of charged particle beam lithography as set forth in claim 1, wherein the circular pattern is delineated by storing relationships of types of individual ones and combinations of the circular apertures used for shots corresponding to diameters of circular patterns to beam doses in a memory, reading a type of individual ones and combinations of the circular apertures used for shots and data about beam doses from the memory based on the diameter of the circular pattern to be delineated, and making a single shot of the shaped circular beam passed through any one of the circular apertures in the second shaping slit member according to the data or making overlapped shots of circular beams shaped with different ones of the circular apertures in the second shaping slit member onto the workpiece such that the circular beams are coincident with each other in center position.

3. A method of charged particle beam lithography as set forth in any one of claims 1 and 2, wherein when the circular beams shaped with the different ones of the circular apertures in said second shaping slit member are shot onto the workpiece in an overlapping manner such that the beams are coincident with each other in central position, irradiation times of the shots are made equal to each other.

* * * * *